United States Patent
Suzuki et al.

(10) Patent No.: US 10,665,480 B2
(45) Date of Patent: May 26, 2020

(54) PLANARIZING PROCESSING METHOD AND PLANARIZING PROCESSING DEVICE

(71) Applicants: TOHO ENGINEERING CO., LTD., Yokkaichi-shi (JP); OSAKA UNIVERSITY, Suita-shi, Osaka (JP)

(72) Inventors: Eisuke Suzuki, Yokkaichi (JP); Kazuto Yamauchi, Suita (JP); Tatsutoshi Suzuki, Yokkaichi (JP); Daisuke Suzuki, Yokkaichi (JP)

(73) Assignees: OSAKA UNIVERSITY, Suita-Shi, Osaka (JP); TOHO ENGINEERING CO., LTD., Yokkaichi-Shi (JP)

( * ) Notice: Subject to any disclaimer, the term of this patent is extended or adjusted under 35 U.S.C. 154(b) by 54 days.

(21) Appl. No.: 16/227,270

(22) Filed: Dec. 20, 2018

(65) Prior Publication Data

US 2019/0122904 A1    Apr. 25, 2019

Related U.S. Application Data

(62) Division of application No. 15/315,864, filed as application No. PCT/JP2015/086493 on Dec. 28, 2015, now Pat. No. 10,199,242.

(30) Foreign Application Priority Data

Dec. 31, 2014  (JP) ................ 2014-267111

(51) Int. Cl.
*H01L 21/67*    (2006.01)
*H01L 21/302*   (2006.01)
(Continued)

(52) U.S. Cl.
CPC ........ *H01L 21/67075* (2013.01); *B01J 23/42* (2013.01); *B01J 35/02* (2013.01);
(Continued)

(58) Field of Classification Search
CPC ................................. H01L 21/67075
See application file for complete search history.

(56) References Cited

U.S. PATENT DOCUMENTS

| 5,245,790 A | 9/1993 | Jerbic |
| 5,630,748 A | 5/1997 | Guenin |

(Continued)

FOREIGN PATENT DOCUMENTS

| DE | 69314335 | 11/1997 |
| JP | H0621029 A | 1/1994 |

(Continued)

OTHER PUBLICATIONS

But Van Pho et al., High-Resolution TEM Observation of 4H-SiC (0001) Surface Planarized by Catalyst-Referred Etching, Materials Science Forum, vols. 717-720, pp. 873-876 (May 2012).

(Continued)

*Primary Examiner* — Roberts P Culbert
(74) *Attorney, Agent, or Firm* — J-Tek Law PLLC; Jeffrey D. Tekanic; Scott T. Wakeman

(57) ABSTRACT

A method for planarizing a workpiece includes bringing a surface of the workpiece and a surface of a pad having a catalyst layer at least on the surface thereof into contact with or proximal to each other, rotating a first one of the workpiece and the pad in a plane of the surface of the first one around a central axis that intersects the surface of the first one while supplying a liquid that supports a catalytic reaction between the surface of the workpiece and the catalyst layer on the surface of the pad, and simultaneously reciprocally moving a second one of the workpiece and the pad in a direction parallel to the surface of the second one by at least an amount that makes possible planarization of the surface of the workpiece based on the catalytic reaction.

18 Claims, 7 Drawing Sheets

(51) Int. Cl.
*H01L 21/306* (2006.01)
*H01L 29/16* (2006.01)
*B01J 23/42* (2006.01)
*B01J 35/02* (2006.01)
*H01L 21/02* (2006.01)
*H01L 29/20* (2006.01)

(52) U.S. Cl.
CPC .. *H01L 21/02019* (2013.01); *H01L 21/02024* (2013.01); *H01L 21/302* (2013.01); *H01L 21/30604* (2013.01); *H01L 21/30612* (2013.01); *H01L 29/1608* (2013.01); *H01L 29/2003* (2013.01)

(56) References Cited

U.S. PATENT DOCUMENTS

| | | |
|---|---|---|
| 5,934,979 A | 8/1999 | Talieh |
| 6,517,667 B1 | 2/2003 | Nakayoshi |
| 6,527,625 B1 | 3/2003 | Kajiwara et al. |
| 6,540,590 B1 | 4/2003 | Kajiwara et al. |
| 6,719,618 B2 | 4/2004 | Homma et al. |
| 6,881,134 B2 | 4/2005 | Brown |
| 2001/0010305 A1 | 8/2001 | Takahashi |
| 2001/0016470 A1 | 8/2001 | Nobe |
| 2002/0173223 A1 | 11/2002 | Gitis et al. |
| 2003/0119425 A1 | 6/2003 | Suzuki |
| 2004/0198056 A1 | 10/2004 | Suzuki |
| 2004/0198199 A1 | 10/2004 | Suzuki |
| 2004/0198204 A1 | 10/2004 | Suzuki |
| 2004/0209551 A1 | 10/2004 | Suzuki |
| 2006/0137170 A1 | 6/2006 | Suzuki |
| 2006/0154577 A1 | 7/2006 | Suzuki |
| 2007/0032182 A1 | 2/2007 | Suzuki |
| 2008/0064311 A1 | 3/2008 | Suzuki |
| 2008/0073222 A1 | 3/2008 | Yamauchi et al. |
| 2010/0147463 A1 | 6/2010 | Yamauchi et al. |
| 2010/0176089 A1 | 7/2010 | Delamarche et al. |
| 2011/0319000 A1 | 12/2011 | Suzuki et al. |
| 2012/0003903 A1 | 1/2012 | Suzuki et al. |
| 2012/0019177 A1 | 1/2012 | Kaufmann et al. |
| 2012/0244649 A1 | 9/2012 | Sano et al. |
| 2013/0029566 A1 | 1/2013 | Suzuki et al. |
| 2013/0288577 A1 | 10/2013 | Chen et al. |
| 2014/0051249 A1 | 2/2014 | Suzuki et al. |
| 2014/0113533 A1 | 4/2014 | Fung et al. |
| 2014/0318363 A1 | 10/2014 | Bennett |
| 2016/0167193 A1 | 6/2016 | Eryu et al. |
| 2017/0047237 A1 | 2/2017 | Kobata et al. |
| 2017/0069506 A1 | 3/2017 | Yamauchi et al. |
| 2017/0098559 A1 | 4/2017 | Suzuki et al. |

FOREIGN PATENT DOCUMENTS

| | | |
|---|---|---|
| JP | 2002283226 A | 10/2002 |
| JP | 2004017229 | 1/2004 |
| JP | 2004223636 A | 8/2004 |
| JP | 2006114632 A | 4/2006 |
| JP | 2007283410 A | 11/2007 |
| JP | 2008049430 A | 3/2008 |
| JP | 2008081389 A | 4/2008 |
| JP | 2008121099 A | 5/2008 |
| JP | 2008136983 A | 6/2008 |
| JP | 2009117782 A | 5/2009 |
| JP | 2009184088 A | 8/2009 |
| JP | 2010205796 A | 9/2010 |
| JP | 2012064972 A | 3/2012 |
| JP | 2012235072 A | 11/2012 |
| JP | 2013255961 A | 12/2013 |
| JP | 2014038981 A | 2/2014 |
| JP | 2015514599 A | 5/2015 |
| WO | 2015159973 A1 | 10/2015 |

OTHER PUBLICATIONS

English translation of International Search Report for parent application No. PCT/JP2015/086493.
English translation of Written Opinion of the International Searching Authority for parent application No. PCT/JP2015/086493.
Hideyuki Hara,et al., (2007) Catalyst-referred etching of silicon,Science and Technology of Advanced Materials, 8:3, 162-165, DOI: 10.1016/j.stam.2006.12.004.
Office Action from the Japanese Patent Office dated Dec. 6, 2016 in related Japanese application No. 2016-528258, and translation of substantive portions thereof.
Yasuhisa Sano et al., "Abrasive-Free Polishing of SiC Wafer Utilizing Catalyst Surface Reaction"; Abstract #1952, 224th ECS Meeting, 2013.

PLANARIZING PROCESSING METHOD AND PLANARIZING PROCESSING DEVICE

CROSS-REFERENCE

This application is a divisional application of U.S. patent application Ser. No. 15/315,864 filed on Dec. 2, 2016, which is the US national stage of International Patent Application No. PCT/JP2015/086493 filed on Dec. 28, 2015, which claims priority to Japanese Patent Application No. 2014-267111 filed on Dec. 31, 2014.

TECHNICAL FIELD

The present invention relates to a planarization processing method and to a planarization processing device, and particularly to a method and a device that can be suitably employed in planarization processing using a catalyst-aided chemical processing method.

BACKGROUND ART

In Patent Literature 1 and Patent Literature 2, catalyst-aided chemical processing methods are disclosed. Catalyst-aided chemical processing methods include using a catalyst composed of a transition metal that is disposed on a processing base surface, placing a workpiece in a solution that does not contain abrasive grains, etc., bringing the processing base surface into contact with or proximal to the processed surface of the workpiece, causing the processing base surface and the processed surface to move relative to each other, producing compounds in a chemical reaction between active species generated from the solution and surface atoms of the workpiece, and removing the compounds to process (etch) the workpiece; it is thereby possible to planarize (reduce the surface roughness of) a surface of difficult-to-process substrates made, for example, of SiC and GaN with high precision approximately at an atomic level.

Incidentally, as a method of causing relative movement of the surface of the pad, which is formed of a transition metal layer that serves as the catalyst layer, and the surface of the processed substrate (processed surface), which serves as the workpiece, a large-diameter circular pad is rotated on a platen, and the surface of the processed substrate, which has a smaller diameter and is held by a rotating holder, is brought into contact or proximity with a circumferential portion of the surface of the pad that is undergoing rotating movement, as shown conventionally in Patent Literature 1.

CITATION LIST

Patent Literature

Patent Literature 1: Japanese Laid-Open Patent Publication No. 2006-114632
Patent Literature 2: Japanese Laid-Open Patent Publication No. 2007-283410

SUMMARY OF THE INVENTION

In the processing methods of the related art described above, however, the apparatus is large because the diameter of the pad is at least twice the diameter of the workpiece, and an economical processing is not achieved because it takes a long period of time to process SiC and GaN substrates. Further, although the processed substrate is rotated while being pressed against the pad surface by the back pressure of an airbag provided in the holder, the processed substrate is pulled towards the pad surface by the so-called water-adhesion effect resulting from the solution that is supplied between the processed substrate and the pad having the catalyst layer of Pt or the like formed on the surface and that is a smooth flat surface; therefore, a large circumferential rotary force of the pad acts on the processed substrate, pulls the processed substrate away from the holder, and hurls it toward the outer circumference of the pad, resulting in a risk of damage by it being caught, etc., on an outwardly-located retainer. Thus, this decreased yields and has led to an increase in processing costs.

Accordingly, the present invention solves such problems, and an object of the present invention is to provide a planarization processing method and a planarization processing device capable of making the device more compact, reducing the risk of workpiece damage during processing and suppressing an increase in processing costs while achieving precise planarization processing.

To achieve the object described above, a planarization processing method according to the present invention is characterized by comprising: bringing a surface of a workpiece and a surface of a pad having a catalyst layer at least on the surface thereof into contact with or proximal to each other; rotating one of the workpiece and the pad in a plane of the surface thereof and around an axis that intersects the surface; simultaneously moving the other of the workpiece and the pad in a direction parallel to the surface thereof by at least an amount that makes possible planarization based on a catalytic reaction, and supplying a liquid necessary for the catalytic reaction between the surface of the workpiece and the surface of the pad that are in contact with or in proximity to each other.

Here, the movement in the direction parallel to the surface may be movement that excludes rotation around the above-mentioned axis. The movement in the direction parallel to the surface can be a reciprocating movement. In this case, the travel distance of an outer circumference of the one of the workpiece and the pad, which is rotated, may be set so as to be 120% or less (excluding 0%) of the travel distance of the other of the workpiece and the pad, which moves in the direction parallel to the surface. It is noted that, instead of rotating one of the workpiece and the pad and moving the other in the direction parallel to the surface, one of the workpiece and the pad may be kept stationary and the other may be rotated and moved in the direction parallel to the surface.

In the planarization processing method according to the present invention, when planarization processing is performed using a catalyst-aided chemical processing method, one of the workpiece and the pad is rotated relative to the other and the other is moved relative to the one by at least an amount that makes possible planarization based on a catalytic reaction with the intention of averaging of the etching, whereby precise planarization processing is achieved. With respect to the movement at this time, a travel distance at the atomic-level suffices to make possible the processing. Therefore, it is not necessary to use a large-diameter pad, unlike in the related art; thus, because it is possible to set the outer diameter of the pad to be approximately equal to the outer diameter of the workpiece, the device can be miniaturized. In this case, if the movement described above is a reciprocating motion, the travel distance of the workpiece or the pad can be further reduced. Since it is not necessary to use a large-diameter pad, a large circumferential rotary force does not act on the workpiece, unlike in the related art, whereby the risk that the workpiece is hurled off toward the outer circumference of the pad and is damaged can be avoided. An increase in processing costs can therefore be suppressed.

A planarization processing device according to one aspect of the present teachings includes first holding means (4; 8) that holds a rear surface of one of a workpiece (7) and a pad (6) having a catalyst layer at least on a surface thereof; first drive means (101) that rotates one of the workpiece (7) and the pad (6) in a plane of the surface of the one of the workpiece (7) and the pad (6) and around an axis that intersects the surface; second holding means (4; 8) that holds the other of the workpiece (7) and the pad (6) and causes the surface thereof to face the surface of the one of the workpiece (7) and the pad (6); second drive means (5, 51-55, 58; 59) that moves the second holding means (4; 8) in a direction parallel to the surface of the other of the workpiece (7) and the pad (6) by at least an amount that makes possible planarization based on a catalytic reaction; and optionally third drive means (102) that advances the first holding means (4; 8) or the second holding means (4; 8) in a direction that intersects the surface of the workpiece (7) or the pad (6) to bring the surface of the workpiece (7) and the surface of the pad (6) into contact with or proximal to each other.

Here, the movement in the direction parallel to the surface can be a reciprocating movement. In this case, the travel distance of the outer circumference of the one of the workpiece and the pad, which is rotated, may be set to be 120% or less (excluding 0%) of the travel distance of the other of the workpiece and the pad, which moves in the direction parallel to the surface. It is noted that, instead of rotating one of the workpiece and the pad and moving the other in the direction parallel to the surface, one of the workpiece and the pad may be kept stationary and the other may be rotated and moved in the direction parallel to the surface. Since the planarization processing device according to the present invention can carry out the planarization processing method according to the present invention, the same advantageous effects described above are provided.

The reference numerals in parentheses in the preceding paragraph provide, solely for reference purposes, the a representative, non-limiting correspondence of means plus function features with specific embodiments or structures that will be further described in the following.

As described above, according to the present invention, while achieving precise planarization processing, the device can be miniaturized, the risk of damage of the workpiece during processing is lessened, and an increase in processing costs can be suppressed.

DETAILED DESCRIPTION

It is noted that the embodiments described below are merely examples, and a variety of design improvements, which a person skilled in the art makes within a range that does not depart from the gist of the present invention, also fall within the scope of the present invention.

First Embodiment

Figure 1:
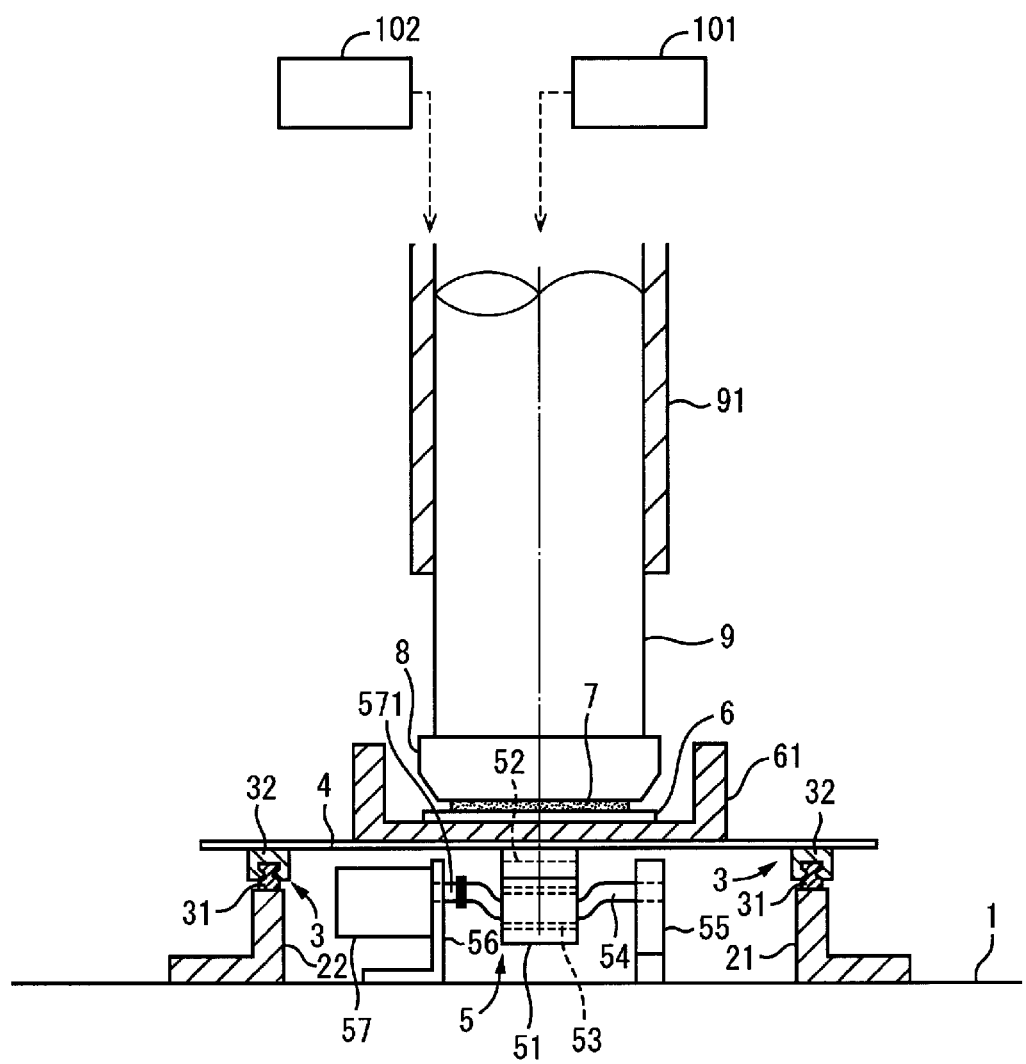
FIG. 1 is a main portion, partial cross-sectional front view of a planarization processing device in a first embodiment of the present invention.
Figure 2:
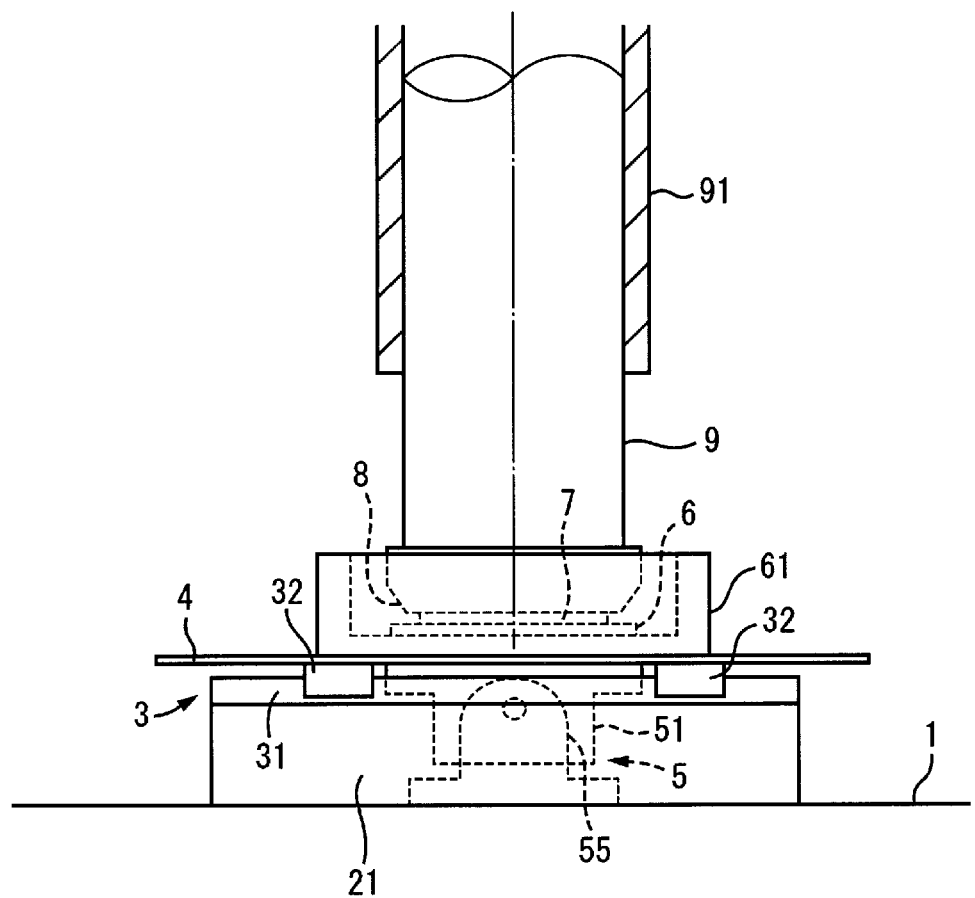
FIG. 2 is main portion, partial cross-sectional side view of the planarization processing device.

FIG. 1 is a partial cross-sectional front view of a planarization processing device that carries out a method according to the prevent invention, and FIG. 2 is a side view of the planarization processing device. In FIG. 1, stands 21 and 22, which have symmetric letter-L-shaped cross sections, are disposed in parallel to each other on the right and left sides on a base 1 and extend in the forward/rearward direction in FIG. 1 (rightward/leftward direction in FIG. 2); rails 31, which form linear guides 3, are fixed onto the right and left stands 21, 22 so as to extend therealong. Each of the rails 31 is provided with sliders 32, which are slidable along the rail 31, at two locations in the longitudinal direction thereof; a rectangular support plate 4 serving as a second holding means is placed on the right-left, front-rear sliders 32. The support plate 4 is therefore linearly reciprocally movable along the rails 31.

Figure 3:
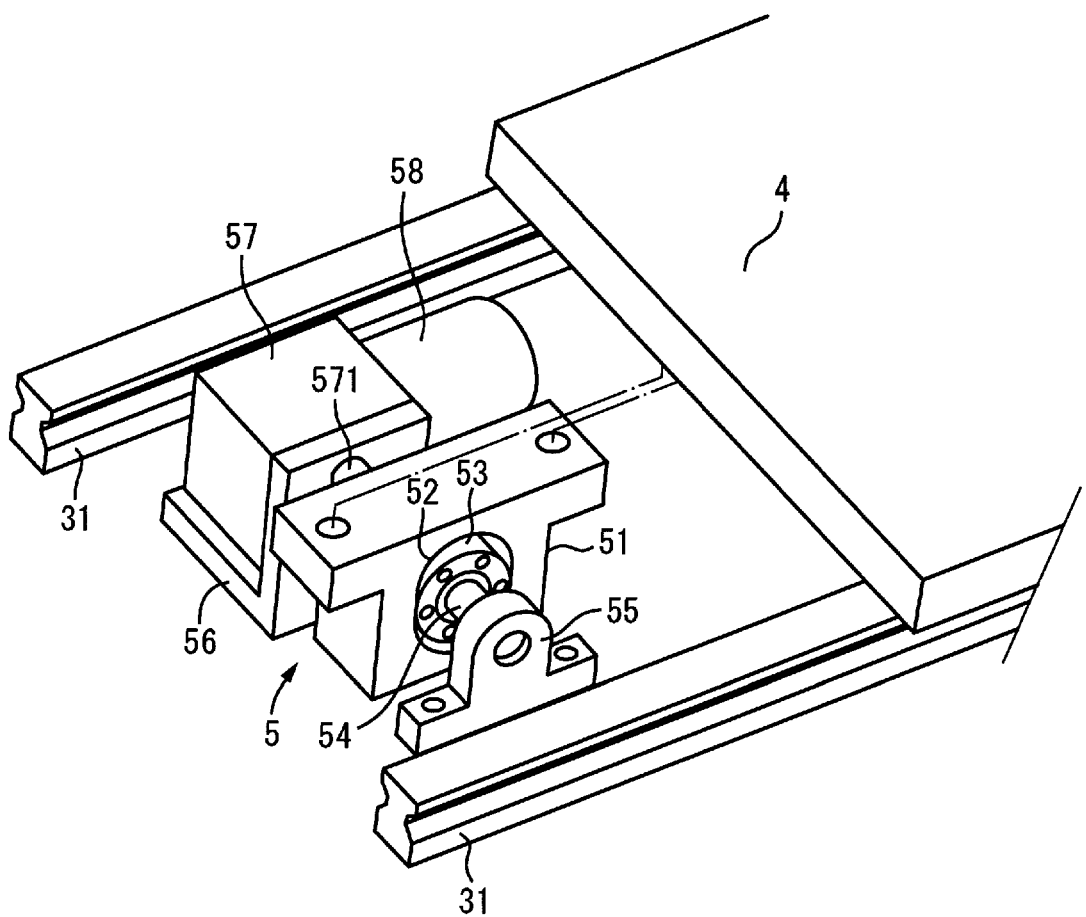
FIG. 3 is a perspective view of a reciprocating drive mechanism.

A cam block 51, which constitutes a reciprocating drive mechanism 5 that extends downward and will be described below, is fixed to a central portion of the lower surface of the support plate 4. The cam block 51 is a thick protruding body extending in parallel to the rails 31, as shown in FIG. 3; a cam opening 52, which is elongated in the upward/downward direction, is formed in a longitudinally central portion of the cam block 51 in such a way that the cam opening 52 passes through the cam block 51 in the horizontal direction. A cam body 53, which has a circular shape with a diameter approximately equal to the minor diameter of the opening 52, is provided in the cam opening 52 so as to be movable along the cam opening 52 in the upward/downward direction.

A crankshaft 54 is provided so as to pass through the above-described cam body 53 in the horizontal direction; the crankshaft 54 passes through the center of the cam body 53 in such a way that the crankshaft 54 can rotate relative to the cam body 53. A central portion of the crankshaft 54 is eccentric from the line that connects the right and left opposite ends of the crankshaft 54, one end of the crankshaft 54 being rotatably supported by a bearing member 55, which is provided so as to stand on the base 1; the other end of the crankshaft 54 is coupled to an output shaft 571 of a speed reducer 57, which is fixed, in a horizontal attitude, to an upright wall of a letter-L-shaped support plate 56. A drive motor 58 (FIG. 3) is attached to the speed reducer 57.

In the structure described above, when the drive motor 58 is driven to rotate the crankshaft 54, the cam body 53, through which the central portion of the crankshaft 54 passes, undergoes rotating movement in a vertical plane while moving upward and downward in the cam opening 52. As a result, in response to the rotation of the crankshaft 54, the cam block 51 and the support plate 4, which is integral therewith, are caused to undergo linear reciprocating movement in the direction along the rails 31. The reciprocating drive mechanism 5, which produces the linear reciprocating motion described above, is an example of a second drive means.

A circular container 61, which stores liquid and opens upward, is provided so as to be placed on a central portion of the upper surface of the support plate 4. A pad 6, which has a catalyst layer with a predetermined thickness formed by a sputtering process or the like on the entire surface thereof, is provided on the bottom surface of the container 61. Rubber or urethane or the like, which is resistant to the processing solution, is used as the material of the pad 6. A transition metal, such as Pt, can be used as the catalyst. The diameter of the pad 6 may be set so as to be slightly greater than the outer diameter of a processed substrate 7.

A spindle 9, which has a circular cross-sectional shape, is provided above the container 61 so as to be vertically oriented and is held by a sleeve 91 so as to be rotatable with a vertical attitude. The spindle 9 is rotated by a drive motor 101 (FIG. 1) serving as a first drive means. The sleeve 91 is lifted and lowered by a drive cylinder 102 serving as a third drive means, and the spindle 9 is caused to move frontward and rearward relative to the pad 6 or to approach and move away from the pad 6 in response to the motion of the sleeve 91. A holder 8 serving as a first holding means is provided at the lower end of the spindle 9 and holds the processed substrate 7. The holder 8 is a known holder and will be described below in detail.

Figure 4:
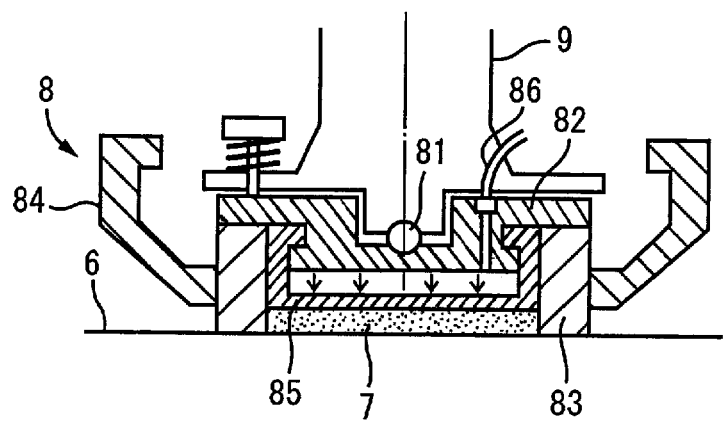
FIG. 4 is a schematic cross-sectional view of a holder.

FIG. 4 shows the holder 8 in detail. In FIG. 4, a base body 82 having a circular plate-shape is attached to the lower end surface of the spindle 9 via a ball 81, which is located at the center of the base body 82 and is interposed between the base body 82 and the lower end surface in such a way that the angle of the base body 82 is changeable with respect to the lower end surface; a wall-shaped retainer 83 is provided so as to be vertically oriented and extend along the entire outer circumferential edge of the lower surface of the base body 82. A cover body 84 is provided so as to protrude outward and upward and extend along the entire outer circumference of the retainer 83. The processed substrate 7 is accommodated in the retainer 83; a diaphragm 85 is located behind the processed substrate 7 and between the processed substrate 7 and the base body 82. Compressed air is supplied into the diaphragm 85 through an air supply tube 86 so that, when the spindle 9 has been lowered, the processed substrate 7 is pressed against the surface of the pad 6 by a pressing force produced by the inflated diaphragm 85. It is noted that a plurality of suction holes is formed in the diaphragm 85; when the spindle 9 is lifted, the interior of the diaphragm 85 is evacuated, the processed substrate 7 is suctioned towards the suction holes and it is held in the holder 8.

When a planarization processing of the lower surface (processed surface) of the processed substrate 7 is performed using a planarization processing device having such a structure, a liquid necessary for the catalytic reaction, such as HF, HCL, pure water or the like, is filled into the container 61, the spindle 9, i.e. the processed substrate 7, is rotated, and at the same time the container 61 on the support plate 4 is caused to undergo a linear reciprocating motion in the horizontal direction along the rails 31. That is, the processed surface of the processed substrate 7 and the pad 6, which has the contacting catalyst layer formed thereon, are caused to rotate relative to each other and are simultaneously caused to undergo a relative reciprocating motion in a plane that intersects the axis of the rotation. The processed surface of the processed substrate 7 thus undergoes planarization processing in accordance with catalyst-aided chemical processing with high precision approximately at an atomic level.

In this case, the relationship between the number of revolutions of the relative rotation and the relative reciprocating motion is preferably set so that the travel distance of the outer circumference of the processed substrate 7 is 120% or less (excluding 0%) of the reciprocating travel distance of the relative reciprocating motion. Here, although the range of movement of the reciprocating movement may intrinsically be within a minute range at the level of several atoms, it is determined based upon mechanical constraints and vibration frequency.

According to the planarization processing method described above, even if the processed substrate 7 is suctioned towards the surface of the pad 6 due to the water-adhesion effect, a large circumferential rotary force does not act on the processed substrate 7, unlike in the conventional art, because the surface of the pad 6 only undergoes a minute reciprocating motion. Thus, unlike in the conventional art, there is no problem of the processed substrate separating from the holder and being caught by the outer retainer, resulting in damage or the like.

Example Based on the Present Embodiment and Comparative Examples

An SiC substrate having an outer diameter of 6 inches was used as the processed substrate 7, and ultrapure water was used as the liquid necessary for the catalytic reaction to perform the planarization processing. A Pt film serving as the catalyst layer was formed on the surface of a pad 6 having a diameter of 160 mm. In this state, the processed substrate 7 was rotated, and the support plate 4 (that is, the pad 6) was caused to undergo reciprocating motion. The processed surface of the processed substrate 7 after the processing was observed with a noncontact three-dimensional surface profiler (Zygo NewView 6300 manufactured by ZYGO CORPORATION, USA). As a result thereof, Ra was 0.181 nm or smaller, and RMS was 0.228 nm or smaller, over the entire processed surface and in a field of view of 0.11 mm square.

In contrast, when only the relative rotation of the processed surface with respect to the pad was performed and relative reciprocating motion was stopped, conspicuous grooves extending in the circumferential direction of the processed surface were produced and uniform planarization was not performed. Further, when only the relative reciprocating motion of the processed surface with respect to the pad was performed and relative rotation was stopped, conspicuous grooves extending across the processed surface were produced and uniform planarization was not performed in this case as well. In the end, uniform planarization can be achieved when the travel distance of the outer circumferential portion of the processed substrate is set so as to be 120% or less of the reciprocating travel distance in the relative reciprocating motion.

Second Embodiment

Figure 5:
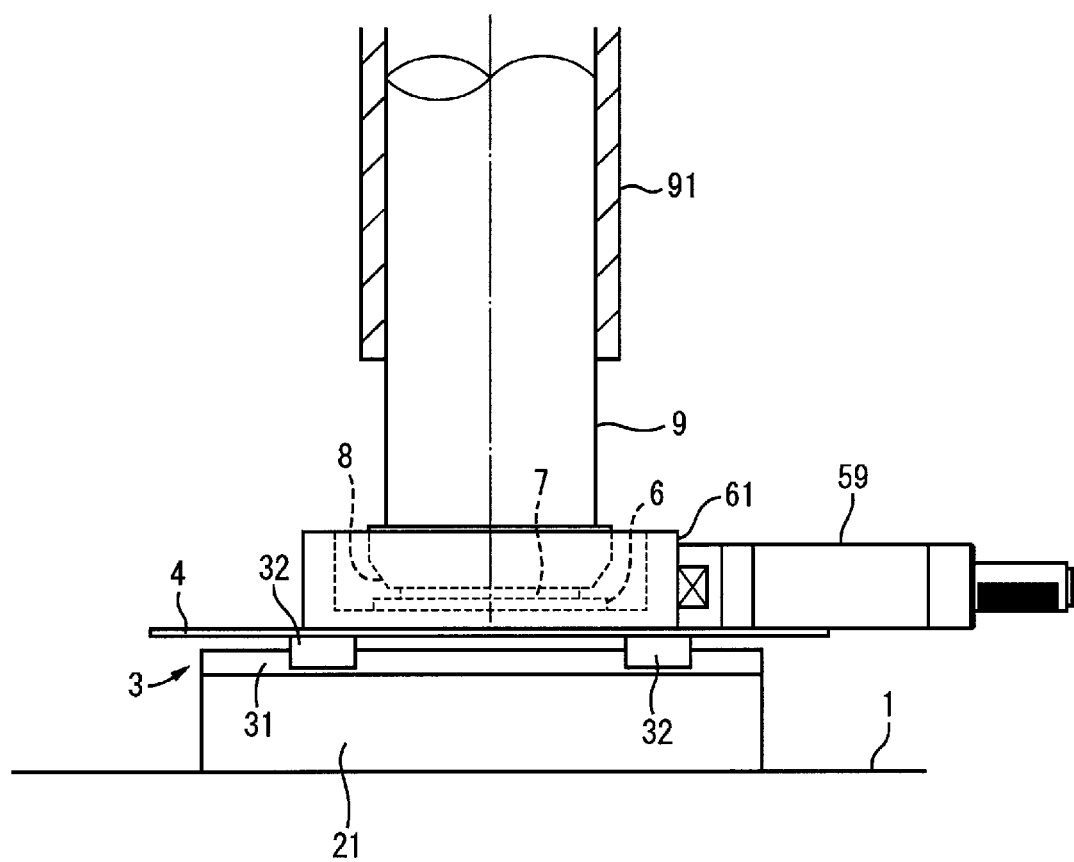
FIG. 5 is a main portion, partial cross-sectional side view of a planarization processing device in a second embodiment of the present invention.

FIG. 5 shows another example of a planarization processing device. FIG. 5 corresponds to FIG. 2 of the first embodiment, and the same reference symbols represent the same parts. In the present embodiment, in place of the reciprocating drive mechanism 5 in the first embodiment, a piston vibrator 59 is provided on the support plate 4 in the horizontal direction, and vibratory forces produced by the piston vibrator 59 cause the support plate 4 to undergo reciprocating movement (vibration) along the rails 31. By using such a structure as well, the substrate surface of the processed substrate 7 undergoes planarization processing in accordance with catalyst-aided chemical processing with high precision approximately at an atomic level similar to the first embodiment; moreover, it is possible to simplify the reciprocating drive structure.

Example Based on the Present Embodiment and Comparative Examples

Figure 8:
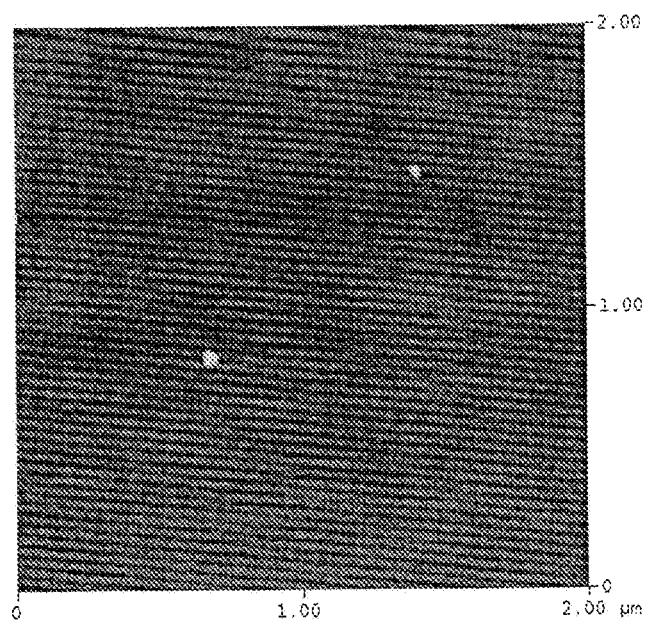
FIG. 8 is a scanning probe microscope photograph of a processed surface of a processed substrate.

A GaN substrate having an outer diameter of 2 inches was used as the processed substrate 7, and ultrapure water was used as the liquid necessary for the catalytic reaction to perform the planarization processing. A Pt film serving as the catalyst layer was formed on the surface of a pad 6 having a diameter of 53 mm. In this state, the processed substrate 7 was rotated, and the support plate 4 (that is, the pad 6) was caused to undergo reciprocating motion. The processed surface of the processed substrate 7 after the processing was observed with the noncontact three-dimensional surface profiler (Zygo NewView 6300 manufactured by ZYGO CORPORATION, USA). As a result thereof, Ra was 0.3 nm or smaller, and RMS was 0.4 nm or smaller, over the entire processed surface and in a field of view of 0.54 mm square. The processed surface was then observed with a scanning probe microscope (Dimension Edge manufactured by BRUKER AXS CORPORATION, USA). As a result thereof, step terraces (0.26 nm) for each Ga single atom layer in a field of view of 2 μm square, as shown in FIG. 8, could be confirmed. Further, during the planarization processing, the problem of separation of the processed substrate 7 from the holder 8 followed by damage of the processed substrate 7 did not occur.

Third Embodiment

Figure 6:
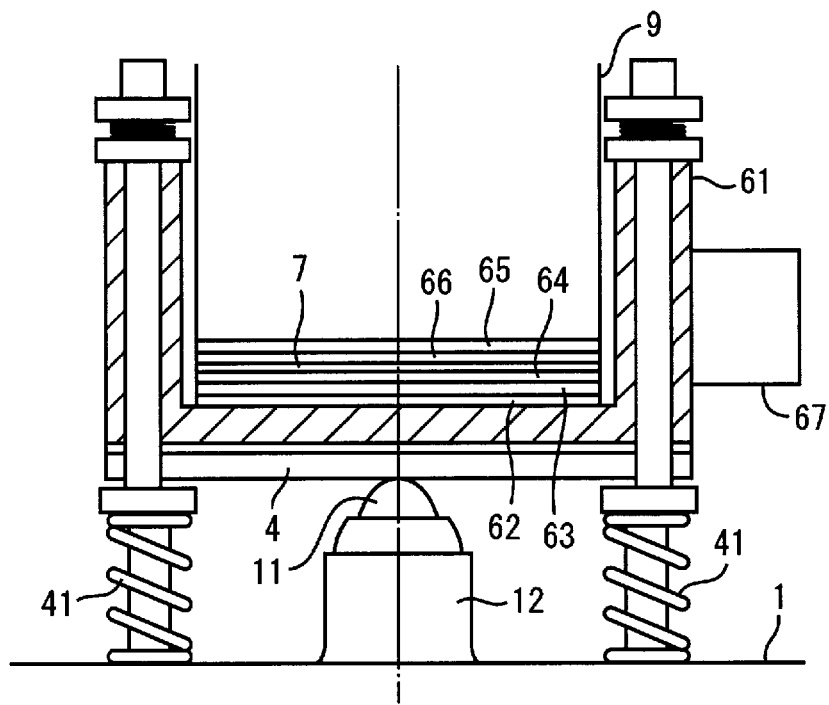
FIG. 6 is a main portion partial cross-sectional front view of a planarization processing device in a third embodiment of the present invention.

In FIG. 6, the support plate 4 is disposed above the base 1 with the four corners of the lower surface of the support plate 4 supported by coil springs 41, and the liquid storing container 61 is provided on the support plate 4. A cushion layer 63 having a pad 64 thereon is placed in the container 61 on the bottom side via an adhesive tape layer 62, and the processed substrate 7 is placed on the upper surface of the pad 64. The center of the lower surface of the support plate 4 is placed on the vertex of a support member 11, which has an upwardly convex shape, so that the support plate 4 is shakeable in the three-dimensional space. The support member 11 is held on the base 1 by a holding member 12. A vibrator 67 is attached to the side surface of the container 61. The spindle 9 enters the container 61 from above, and a pad 66 is bonded to the lower surface of the spindle 9 via a cushion layer 65.

The spindle 9 is lowered so that the pads 64 and 66 sandwich the upper and lower surfaces of the processed substrate 7. In this state, when the spindle 9 is rotated and the vibrator 67 is activated, the rotary force of the spindle 9 and a shaking motion, which includes a horizontal reciprocating movement (vibration) produced by the vibrator 67, are transmitted to the processed substrate 7 and to the upper and lower pads 64, 66, which sandwich the processed substrate 7; thus, either of the upper and lower surfaces of the processed substrate 7 can be planarized with the same precision and uniformity, etc. as in each of the embodiments described above.

Fourth Embodiment

Figure 7:
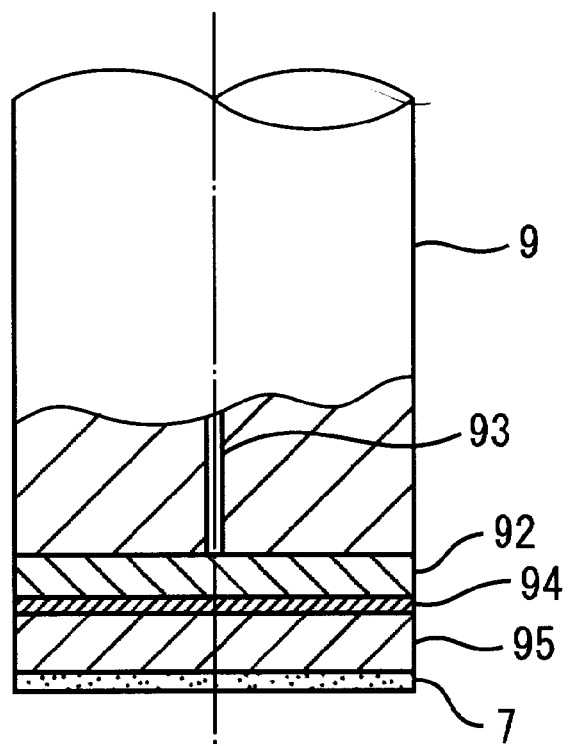
FIG. 7 is a cutaway enlarged cross-sectional view of a processed substrate holding part of a planarization processing device in a fourth embodiment of the present invention.

FIG. 7 shows another example of a structure for holding the processed substrate 7 at the lower end of the spindle 9. In FIG. 7, a header plate 92 is fixed to the lower end of the spindle 9, a plurality of small holes (not shown) is formed in the lower surface of the header plate 92, and a channel that branches into a plurality of channels, which communicate with the small holes, is formed in the header plate 92. A channel 93 is formed in the spindle 9 and communicates with the channels in the header plate 92. A holding plate 95 made, for example, of rubber is provided below the lower surface of the header plate 92 via an adhesive tape layer 94; channels that pass through the holding plate 95 and reach the small holes described above are formed in the holding plate 95, and each of the channels opens through the lower surface of the holding plate 95 as a suction hole.

In the structure described above, when the interior of the channel 93 is evacuated, the processed substrate 7 can be suctioned and held on the lower surface of the holding plate 95 by the suction holes, as shown in FIG. 7; in this state, the planarization processing described in the first embodiment can be performed. When removing the processed substrate 7, compressed air is, for example, supplied into the channel 93.

Other Embodiments

In the first embodiment described above, although the processed substrate is rotated and the pad is caused to undergo a linear reciprocating motion, the processed substrate may be caused to undergo a linear reciprocating motion and the pad may be rotated.

The reciprocating drive mechanism is not limited to the mechanism in the first embodiment described above, and an ordinary crank mechanism that converts rotary motion produced by a drive motor into linear reciprocating motion can be used. Further, a ball screw mechanism, an attraction/repulsion mechanism based on magnetic force, a cylinder mechanism, and other mechanisms can be used. In addition, the reciprocating motion need not necessarily be linear motion. For example, it also may be motion that traces an arc in a two-dimensional plane, such as circular motion. Further, the reciprocating motion need not necessarily be employed, and unidirectional motion may be employed.

In each of the embodiments described above, the base may also be caused to undergo reciprocating movement in the direction parallel to the surface of the base, for example, by using a ball screw mechanism. In this case, planarization of the processed substrate is uniformly performed both on a central portion and on a peripheral portion.

The workpiece is not limited to a plate-shaped object, such as a substrate.

In each of the embodiments described above, although the holder is lifted and lowered, a structure that lifts and lowers the support plate may be employed.

In the first embodiment described above, although a separate pad is provided in the liquid storing container, the pad itself may be formed in the shape of a container so as to store the liquid necessary for the catalytic reaction. It is noted that the liquid need not necessarily be stored and it may be caused to flow between the processed substrate and the pad and then discharged.

In the first embodiment described above, although a drive cylinder is used as the third drive means, it may be replaced with a ball screw mechanism, a robot arm, etc.

EXPLANATION OF THE SYMBOLS

1: Base, 3: Linear guide, 4: Support plate (second holding means), 5: Reciprocating drive mechanism (second drive means), 6: Pad, 61: Container, 7: Processed substrate (workpiece), 8: Holder (first holding means), 9: Spindle, 101: Drive motor (first drive means), 102: Drive cylinder (third drive means)

The invention claimed is:

1. A planarization processing method, comprising:
bringing a surface of a workpiece and a surface of a pad having a catalyst layer at least on the surface thereof into contact with or proximal to each other;
rotating a first one of the workpiece and the pad in a plane of the surface of the first one around a central axis that intersects the surface of the first one while supplying a liquid that supports a catalytic reaction between the surface of the workpiece and the catalyst layer on the surface of the pad; and
simultaneously moving a second one of the workpiece and the pad in a direction parallel to the surface of the second one by at least an amount that makes possible planarization of the surface of the workpiece based on the catalytic reaction;
wherein:
the movement in the direction parallel to the surface is a reciprocating motion; and
an outer circumference of the first one of the workpiece and the pad, which is rotated, travels by a total distance that is greater than 0% and 120% or less of a total distance that the second one of the workpiece and the pad reciprocally travels in the direction parallel to the surface.

2. A planarization processing method, comprising:
causing a surface of a workpiece and a surface of a pad having a catalyst layer at least on the surface thereof to be in contact with or in proximity to each other; and
rotating a first one of the workpiece and the pad in a plane of the surfaces of the first one relative to the a second one of the workpiece and the pad around a central axis that intersects the surface of the first one and simultaneously moving the central axis of the first one relative to the second one in a direction parallel to the surface of the first one by at least an amount that makes possible planarization of the surface of the workpiece based on a catalytic reaction while supplying a liquid that supports the catalytic reaction between the surface of the workpiece and the surface of the pads;
wherein:
the movement in the direction parallel to the surface is a reciprocating motion; and
an outer circumference of the first one of the workpiece and the pad, which is rotated while simultaneously moving the central axis of the first one relative to the second one, travels by a total distance that is greater than 0% and 120% or less of a total distance that the first one of the workpiece and the pad reciprocally travels in the direction parallel to the surface.

3. The planarization processing method according to claim 1, wherein the catalyst layer is composed of a transition metal compound.

4. The planarization processing method according to claim 3, wherein the first one is the workpiece and the second one is the pad.

5. The planarization processing method according to claim 4, wherein the workpiece is a SiC or GaN substrate.

6. The planarization processing method according to claim 5, wherein the reciprocating motion is a linear reciprocating motion.

7. The planarization processing method according to claim 5, wherein the reciprocating motion is vibration.

8. The planarization processing method according to claim 1, wherein, in one time period during the planarization processing, the outer circumference of the first one of the workpiece and the pad, which is rotated, travels by a first distance, the second one of the workpiece and the pad travels by a second distance in the direction parallel to the surface and the first distance is greater than 0% and 120% or less of the second distance.

9. The planarization processing method according to claim 8, wherein the first one is the workpiece and the second one is the pad.

10. The planarization processing method according to claim 9, wherein the movement in the direction parallel to the surface is a linear reciprocating motion.

11. The planarization processing method according to claim 1, wherein the catalyst layer is composed of a transition metal compound.

12. The planarization processing method according to claim 1, wherein the first one is the workpiece and the second one is the pad.

13. The planarization processing method according to claim 2, wherein the catalyst layer is composed of a transition metal compound.

14. The planarization processing method according to claim 13, wherein the first one is the workpiece and the second one is the pad.

15. The planarization processing method according to claim 14, wherein the workpiece is a SiC or GaN substrate.

16. The planarization processing method according to claim 15, wherein the reciprocating motion is a linear reciprocating motion.

17. The planarization processing method according to claim 15, wherein the reciprocating motion is vibration.

18. The planarization processing method according to claim 2, wherein the reciprocating motion is a linear reciprocating motion.

* * * * *